(12) United States Patent
Su et al.

(10) Patent No.: US 7,294,937 B2
(45) Date of Patent: Nov. 13, 2007

(54) APPARATUS AND METHOD FOR MANUFACTURING A SEMICONDUCTOR WAFER WITH REDUCED DELAMINATION AND PEELING

(75) Inventors: Chao-Yuan Su, Koahsiung (TW); Pei-Haw Tsao, Tai-Chung (TW); Hsin-Hui Lee, Koahsiung (TW); Chender Huang, Hsin-Chu (TW); Shang Y. Hou, Hsin-Chu (TW); Shin Puu Jeng, Hsin-Chu (TW); Hao-Yi Tsai, Hsin-Chu (TW); Chenming Hu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 11/495,057

(22) Filed: Jul. 28, 2006

(65) Prior Publication Data

US 2006/0261490 A1 Nov. 23, 2006

Related U.S. Application Data

(63) Continuation of application No. 10/675,862, filed on Sep. 30, 2003, now Pat. No. 7,126,225.

(60) Provisional application No. 60/462,969, filed on Apr. 15, 2003.

(51) Int. Cl.
*H01L 23/544* (2006.01)

(52) U.S. Cl. .................................. 257/797; 438/401

(58) Field of Classification Search ................ 257/797; 438/401, 462
See application file for complete search history.

(56) References Cited

U.S. PATENT DOCUMENTS

| 5,371,411 A | 12/1994 | Hara et al. |
| 6,358,839 B1 | 3/2002 | Li et al. |
| 6,483,173 B2 | 11/2002 | Li et al. |
| 6,876,946 B2 | 4/2005 | Yasuda et al. |
| 2003/0003677 A1 | 1/2003 | Fukada |

OTHER PUBLICATIONS

Pidin, S., et al., "MOSFET Current Drive Optimization Using Silicon Nitride Capping Layer for 65-nm Technology Node," 2004 Symposium on VLSI Technology Digest of Technical Papers, pp. 54-55.

*Primary Examiner*—Fernando L. Toledo
(74) *Attorney, Agent, or Firm*—Slater & Matsil, L.L.P.

(57) ABSTRACT

A multi-layered semiconductor structure with free areas limiting the placement of test keys. First and second scribe lines intersect to define one corner point of a die. The first and second scribe lines are part of the multilayered structure and at least one layer of the multi-layer structure is a low-k dielectric layer. Free area $A_1$ is defined on the first scribe line and is defined by the equation $A_1=D_1 \times S_1$, where $D_1$ is the distance from the corner point of the die toward the main area of the die, and $S_1$ is the width of the first scribe line. Free area $A_S$ is defined at the intersection of the first scribe line and the second scribe line adjacent the die and is defined by the equation $A_S=S_1 \times S_2$, where $S_2$ is the width of the second scribe line.

30 Claims, 13 Drawing Sheets

APPARATUS AND METHOD FOR MANUFACTURING A SEMICONDUCTOR WAFER WITH REDUCED DELAMINATION AND PEELING

This application is a continuation of U.S. patent application Ser. No. 10/675,862, entitled "Apparatus and Method for Manufacturing a Semiconductor Wafer with Reduced Delamination and Peeling," filed on Sep. 30, 2003 now U.S. Pat. No. 7,126,225, which application claims the benefit of U.S. Provisional Application Ser. No. 60/462,969 filed on Apr. 15, 2003, entitled "Semiconductor Wafer with Free Areas for Test Key Placement," both of which applications are hereby incorporated herein by reference.

TECHNICAL FIELD

The invention relates to a semiconductor wafer including an inter-metal-dielectric layer of low dielectric constant (low-k), and more particularly to a design rule for placing test keys on a scribe line. A second embodiment relates to a conductive ring design rule on a corner area of a die. A "free area" that restricts test key placement defined on the scribe line can prevent delamination or peeling near the die corners. One or more slots formed in the conductive ring can prevent the low-k layer from being cracked by stresses exerted at the die corners.

BACKGROUND

IC manufacturers are employing finer circuit widths, low dielectric constant (low-k) materials, and other technologies to make small and high-speed semiconductor devices. Along with these advancements, the challenges of maintaining yield and throughput have also increased. As far as reliability is concerned, the low-k material near die corners has a crack issue, especially in the sawing process.

A semiconductor wafer typically comprises substantially isolated dies (or chips) separated from each other by scribe lines. Individual dies within the wafer contain circuitry, and the dies are separated by sawing and are individually packaged. Alternately, the individual dies may be packaged in multi-chip modules. In a semiconductor fabrication process, the semiconductor device (e.g., an integrated circuit IC) must be continuously tested at every step so as to maintain and assure device quality. Usually, a testing circuit is simultaneously fabricated on the wafer along with the actual devices. A typical testing method provides several test keys located on the scribe lines between dies that may be electrically coupled to an external terminal through a metal pad. The test keys are selected to test different properties of the wafer, such as threshold voltage, saturation current, gate oxide thickness, or leakage current.

In general, the scribe lines are defined in areas of the multi-layer structure that are without a die pattern and have a width of about 80 to 100 µm depending on the dimensions of the dies manufactured in the wafer. In order to prevent cracks induced during wafer sawing from propagating into the die, each die is usually surrounded by a seal ring of 3 to 10 µm in width. Nevertheless, during wafer manufacture, damage is often introduced because of the scribe lines. Further, when at least one layer of the multi-layer structure is composed of a metal material with a high thermal expansion coefficient, the dimensional variation of the layer is sufficient to introduce high-level internal stress into the wafer in the area of the scribe line. Consequently, portions of the wafer around the scribe line suffer damage, such as peeling, delamination, or dielectric fracture. The types of scribe line damage mentioned above are usually observed when the multi-layer structure includes an inter-metal-dielectric layer of low dielectric constant (low-k).

When considering a design rule for placement of test keys on the scribe line, major consideration is that the stress resulting from the sawing process causes serious peeling near the test keys at the die corners. This results in delamination at the interface between the multiple layers at the die corners. Delamination impacts the reliability of the device, and contributes to production of stringers (residual materials) that interfere with further processing and testing of the integrated circuit.

Several solutions have been proposed to solve some of the technical problems associated with the manufacture and sawing of semiconductor wafers. According to some approaches, grooves are formed in the insulating zone by plasma etching. The formation of these grooves stops many, but not all, cracks from forming. Therefore, a novel test key design rule for preventing delamination or peeling near the die corners is called for.

A conductive ring provided on the main area of the die is well known for providing the wiring that supplies the ground potential or power source potential to circuits in the die. It is not uncommon for stresses to crack a passivation film formed over the die corners during the sealing process of a resin mode package. As disclosed in U.S. Pat. No. 5,371,411, one solution to this problem is to form a slot or row of small holes in the guard ring. However, it is not believed that an array of apertures in the guard ring has been used to prevent a crack or defect generated in an inter-metal-dielectric layer resulting from a die sawing process as proposed by the present invention. If a low-k material is used near the guard ring corners, the crack issue becomes more serious and further reduces reliability. Thus, a novel guard ring design rule at the die corners is also taught by the present invention.

SUMMARY OF THE INVENTION

Accordingly, the present invention provides a "free area" that prohibits or substantially limits test key placement on the scribe lines in order to prevent delamination and peeling near the die corners.

The present invention also provides a conductive ring with one or more slots or rows of holes to prevent the low-k material from being cracked by stresses exerted at the die corners.

In some embodiments of the invention, a multi-layer semiconductor wafer structure defines areas where test key placement is restricted. At least one layer of the multi-layer structure is a low-k dielectric layer. Depending upon the requirement of the semiconductor design, these restricted areas may substantially limit or even prohibit the placement of test keys and are referred to herein as "free areas." The semiconductor wafer comprises at least a first and second scribe line. The first scribe line extends along a first direction as part of a multi-layer structure, and the second scribe line extends along a second direction of the multi-layer structure. The intersection of the first scribe line and the second scribe line defines at least one corner point of a main area of a die. At least one "free area" restricting test key placement is defined on the first scribe line adjacent the corner point of the die, in which the "free area" $A_1$ is defined by the equation: $A_1 = D_1 \times S_1$, where $D_1$ is a first distance from the corner point of the die extending toward the main area of the die, and $S_1$ is the width of the first scribe line. Another "free area" $A_S$ is defined on the intersection of the first scribe line and the second scribe line adjacent the corner point of the die. The "free area" $A_S$ is defined by the equation: $A_S=S_1\times S_2$, where $S_1$ is the width of the first scribe line, and $S_2$ is the width of the second scribe line.

The low-k dielectric layer has a dielectric constant less than approximately 3.5 and preferably less than 3.0, and the "free area" is defined on at least one layer of the multi-layer structure of the first scribe line. A few test keys may be allowed in the "free areas" located on the first scribe line or the second scribe line. A measurement ratio $R_1$ is defined by the equation $R_1=M_1/A_1$ where $M_1$ is a total area of the test keys formed on the free area $A_1$. The total area $M_1$ of the test keys is limited such that $R_1$ is less than about 10%. Similarly, measurement ratio $R_S$ is defined by the equation $R_S=M_S/A_S$, where $M_S$ is a total area of the test keys formed on the free area $A_S$. $R_S$ is limited to a value less than 10% by limiting the test key area $M_1$.

In another embodiment of the invention, a fabrication method for a semiconductor wafer with free areas restricting test key placement comprises the following steps. A semiconductor wafer is provided with at least a first and second scribe line, in which at least one corner point of a main area of a die is defined by the intersection of the first scribe line and the second scribe line. At least one "free area" is then formed on the first scribe line adjacent to the corner point of the die. The free area $A_1$ is defined by the equation $A_1=D_1\times S_1$, where $D_1$ is the distance from the corner point of the die extending toward the main area of the die, and $S_1$ is the width of the first scribe line. The die is then separated using a cutting method for separating the dies along the first scribe line and the second scribe line. Both the first scribe line and the second scribe line are defined by the multi-layer structure, and at least one layer of the multi-layer structure is a low-k dielectric layer.

The dies on the wafer may be separated by any suitable method including diamond sawing, laser cutting, liquid jet scribing, water jet cutting or any combination of these cutting methods. The low-k dielectric layer has a dielectric constant less than approximately 3.5 and preferably less than 3.0. The "free area" is preferably defined on the top layer of the multi-layer structure of the first scribe line. Similar to the above discussion, if test keys are to be formed on the first scribe line, the second scribe line or the combination thereof, the area of the test keys should meet the measurement ratio $R_1$. As discussed above, the measurement ratio $R_1$ is defined by the equation $R_1=M_1/A_1$, where $M_1$ is a total area of the test keys formed on the free area $A_1$. Also as discussed above, $M_1$ is limited such that $R_1$ is less than 10%. Likewise, the measurement ratio $R_S$ is defined by the equation $R_S=M_S/A_S$, where $M_S$ is a total area of the test keys formed on the free area $A_S$ and $M_S$ is limited so that $R_S$ is less than 10%.

In another embodiment of the invention, a semiconductor wafer includes a conductive ring with an array of apertures such as slots or holes. A die has a main area comprising a multi-layer structure, and at least one layer of the multi-layer structure is a low-k dielectric layer. A first peripheral region is defined along a first direction of the main area of the die, a second peripheral region is defined along a second direction of the main area of the die, and a corner area is defined by the intersection of the first peripheral region and the second peripheral region. A portion of a conductive ring surrounding the die is formed in the area of the die and adjacent the first peripheral region and the second peripheral region. An array of apertures, such as one or more slots or one or more lines of holes, is formed in the conductive ring and adjacent the corner area of the main area of the die.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of embodiments of the present invention are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

According to one embodiment of the present invention, a semiconductor wafer is provided with "free areas" that restrict the placement of test keys on scribe lines. This limitation or restriction reduces delamination or peeling near the die corners. The "free areas" located on the scribe lines may be used with an LK wafer (low-k wafer). Particularly, the phrase "free areas" restricting test key placement means that a limited arrangement of test keys may be placed or located in the "free area." That is, a few test keys can be located on the free area if a measurement ratio of the test key area to the free area satisfies or falls within an acceptable range. Alternately, a "free area" may be so restricted that no test keys at all are permitted.

Figure 1:
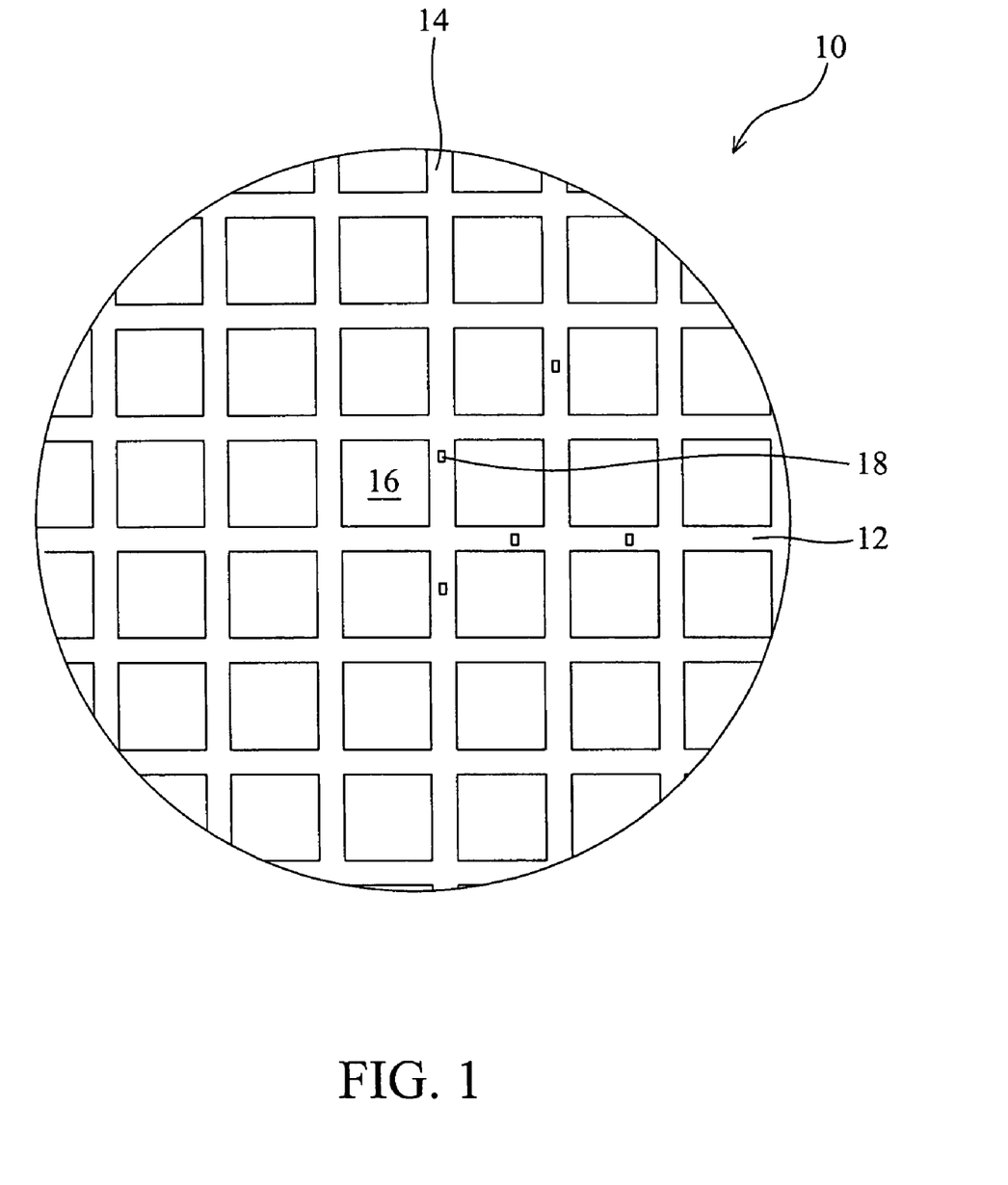
FIG. 1 is a top view of a wafer with dies separated by scribe lines according to an embodiment of the present invention.

FIG. 1 is a top view of a wafer with dies separated by scribe lines according to one embodiment of the present invention. The semiconductor wafer 10 comprises substantially isolated dies (or chips) 16 separated from each other by first scribe lines 12 and second scribe lines 14. The first scribe lines 12 extend along a first direction and the second scribe lines 14 extend along a second direction, in which the intersection of one of the first scribe lines and one of the second scribe lines define at least one corner point of a die 16. For example, in the illustrated embodiment, one of the first scribe lines 12 extend along a horizontal direction, and the second scribe lines 14 extend along a vertical direction, such that their intersection defines corner points of four of the dies 16. Also, the semiconductor wafer 10 comprises test keys 18 located on the scribe lines 12 and 14, except for the restricted or "free areas" described below. Typically, the semiconductor wafer 10 will be an LK (low-k dielectric) wafer, and each of the scribe lines 12 and 14 are defined by the multi-layer structure.

Figure 2:
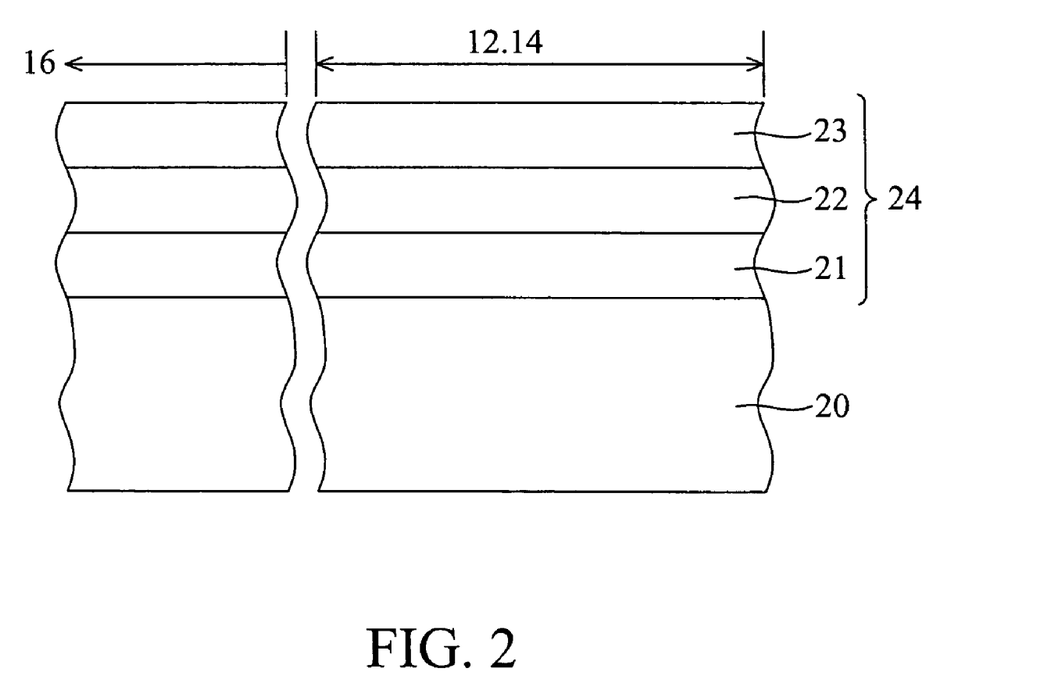
FIG. 2 is a cross-section illustrating the multi-layer structure of the wafer.

FIG. 2 is a cross-section illustrating the multi-layer structure of the wafer including the area of the wafer with the scribe lines. Each of the scribe lines 12 and 14 are formed as part of the multi-layer structure 24 formed on a substrate 20. The substrate 20 may be fabricated using bulk Si, SOI, SiGe, GaAs, InP, or other semiconductor materials. The multi-layer structure 24 comprises layers 21, 22, and 23. At least one of the layers 21, 22, and/or 23 will typically be a low-k dielectric layer of a dielectric constant (k) lower than approximately 3.5, and preferably lower than 3.0. For example, the low-k dielectric layer may be CVD SiOC, CVD SiOCN, Spin-on SiOC, CVD polymer, Spin-on polymer, FSG, or $SiO_2$.

The free areas described below represent at least one layer of the multi-layer structure 24 in the area of the scribe lines 12 or 14. Preferably, the free areas are defined on the top of the multi-layer structure 24. Alternatively, the free areas can be defined on at least one of the top three layers of the multi-layer structure 24.

The individual dies 16 containing circuitry and formed on wafer 10 are separated by suitable cutting methods, such as diamond sawing, laser cutting, liquid jet scribing (such as water jet cutting) or a combination of these cutting methods. The test key 18 may be an auxiliary conductive structure, an electrically activated structure (such as PCM), or a non-electrically activated structure (such as a frame cell).

Examples of the free area that restrict test key placement on the scribe lines 12 and 14 adjacent one corner point of the individual die 16 are described below.

Figure 3A:
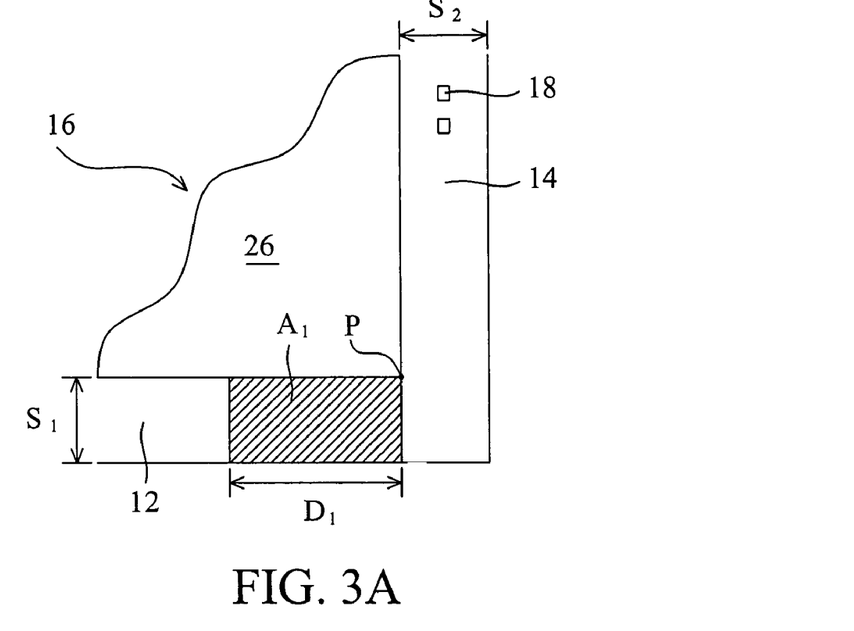
FIG. 3A is a top view illustrating a free area restricting test key placement on a scribe line adjacent one die according to one embodiment of the present invention.

FIG. 3A is a top view illustrating a free area restricting test key placement on the scribe lines adjacent one die according to an embodiment of the present invention. The first scribe line 12 extending along the first direction intersects the second scribe line 14 extending along the second direction to separate a main area 26 of one of the dies 16. The main area 26 with circuit elements formed thereon has a corner point P defined by the intersection of the first scribe line 12 and the second scribe line 14. Also, depending on the test key design rule, test keys 18 may be formed without restriction on the first scribe line 12 or the second scribe line 14, except for the free area $A_1$ near the corner point P. The free area $A_1$ is on the first scribe line 12 adjacent to the corner point P. The free area $A_1$ is defined by the equation $A_1=D_1 \times S_1$, where $D_1$ is a distance from the corner point P toward the main area 26, and $S_1$ is the width of the first scribe line 12. Preferably, $D_1$ is less than 600 μm, and $S_1$ is greater than 20 μm The free area $A_1$ is on at least one layer of the multi-layer structure 24 of the first scribe line 12. Preferably, the free area $A_1$ is on the top of the multi-layer structure 24. Alternatively, the free area $A_1$ is on at least one of the top three layers of the multi-layer structure 24.

Although test keys 18 could be completely prohibited from area $A_1$, preferably a few test keys 18 are permitted on the free area $A_1$ if the measurement ratio $R_1$ is less than about 10%. $R_1$ is defined by the equation $R_1=M_1/A_1$ where $M_1$ is the total area of the test keys 18 formed on the free area $A_1$.

Figure 3B:
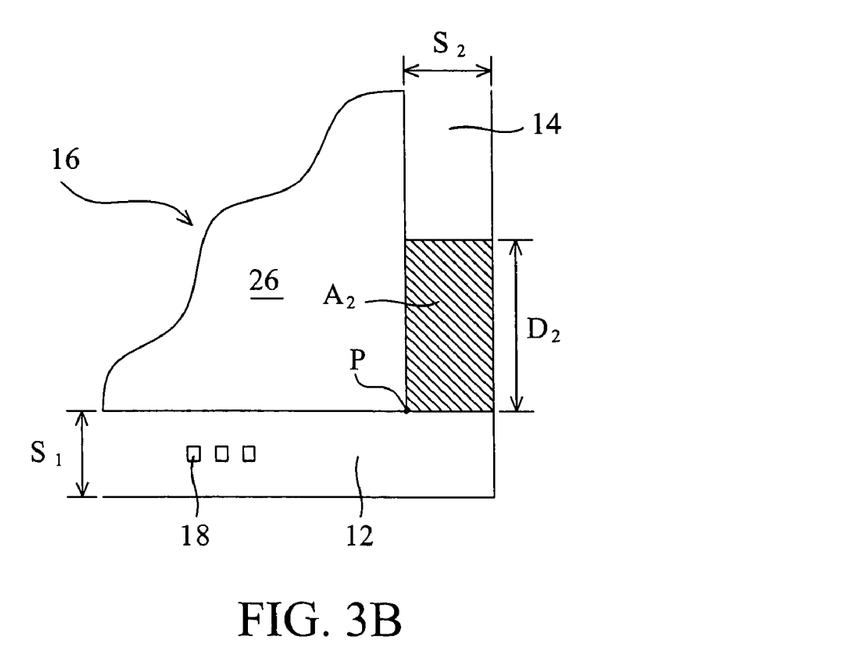
FIG. 3B is a top view illustrating a free area restricting test key placement on a scribe line adjacent one die according to another embodiment of the present invention.

FIG. 3B is a top view illustrating a second example of a free area that restricts test key placement on the scribe lines adjacent one die. Elements similar to those shown in FIG. 3A are omitted here.

Similar to the above discussion, the test keys 18 are formed on the first scribe line 12 or the second scribe line 14 without restriction, except for free area $A_2$ near the corner point P. The free area $A_2$ is on the second scribe line 14 adjacent to the corner point P. The free area $A_2$ is defined by the equation $A_2=D_2 \times S_2$, where $D_2$ is a second distance from the corner point P toward the main area 26, and $S_2$ is the width of the second scribe line 14. Preferably, $D_2$ is less than 600 μm, and $S_2$ is greater than 20 μm.

The free area $A_2$ is on at least one layer of the multi-layer structure 24 of the second scribe line 14. Preferably, the free area $A_2$ is on the top of the multi-layer structure 24. Alternatively, the free area $A_2$ is on at least one of the top three layers of the multi-layer structure 24. As discussed above with respect to the example of FIG. 3A, it is often preferable to also allow the formation of a few test keys 18 on the free area $A_2$ if the measurement ratio $R_2$ is less than 10%. Similar to the embodiment discussed above, $R_2$ is defined by the equation $R_2=M_2/A_2$, where $M_2$ is the total area of the test keys 18 formed on the free area $A_2$.

Figure 3C:
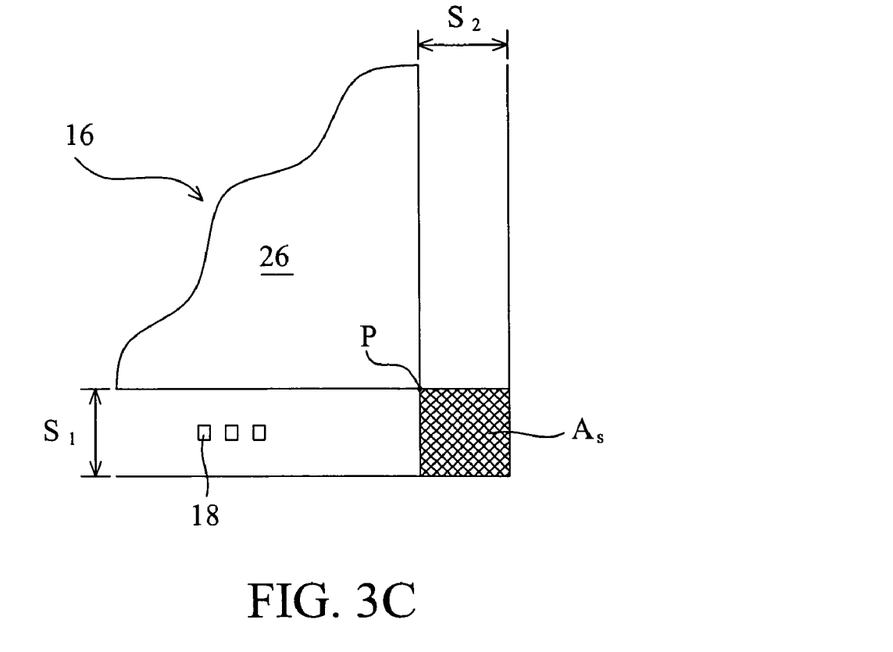
FIG. 3C is a top view illustrating a free area restricting test key placement on a scribe line adjacent one die according to still another embodiment of the present invention.

FIG. 3C is a top view illustrating a third example of a free area that restricts test key placement on the scribe lines adjacent one die. Elements similar to those in FIGS. 3A and 3B are omitted here.

Depending on the test key design rule, the test keys 18 are formed without restriction on the first scribe line 12 or the second scribe line 14, except for a free area $A_S$ near the corner point P. The free area $A_S$ is on the intersection of the first scribe line 12 and the second scribe line 14 adjacent the corner point P. The free area $A_S$ is defined by the equation $A_S=S_1 \times S_2$, where $S_1$ is the width of the first scribe line 12, and $S_2$ is the width of the second scribe line 14. Preferably, $S_1$ is greater than about 20 μm and $S_2$ is greater than about 20 μm<$S_2$.

The free area $A_S$ is on at least one layer of the multi-layer structure 24. Preferably, the free area $A_S$ is on the top of the multi-layer structure 24. Alternatively, the free area $A_S$ is on at least one of the top three layers of the multi-layer structure 24. Also, as discussed above with respect to FIGS. 3A and 3B, it is preferable to allow the formation of a few test keys 18 on the free area $A_S$ if the measurement ratio $R_S$ is no greater than 10%. $R_S$ is defined by the equation $R_S=M_S/A_S$, where $M_S$ is the total area of the test keys 18 formed on the free area $A_S$.

Figure 3D:
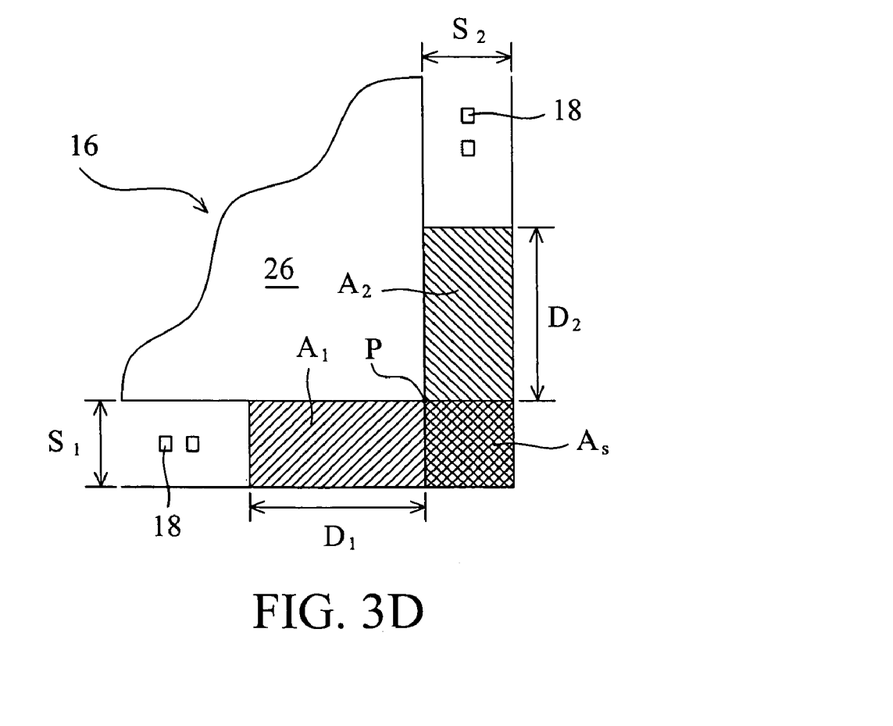
FIG. 3D is a top view illustrating a free area restricting test key placement on a scribe line adjacent one die according to yet another embodiment of the present invention.

FIG. 3D is a top view illustrating a fourth example of free areas that restrict test key placement on the scribe lines adjacent one die. Elements similar to those found in FIGS. 3A through 3C are omitted here.

Depending on the test key design rule, the test keys 18 are formed on the first scribe line 12 or the second scribe line 14, except for the free areas $A_1$, $A_2$, and $A_S$ near the corner point P. Also, as discussed above, it is often preferable to allow the formation of a few test keys 18 on the free areas $A_1$, $A_2$, and $A_S$ if the measurement ratio R is less than 10%. R is defined by the equation $R=(M_1+M_2+M_S)/(A_1+A_2+A_S)$.

Figure 4:
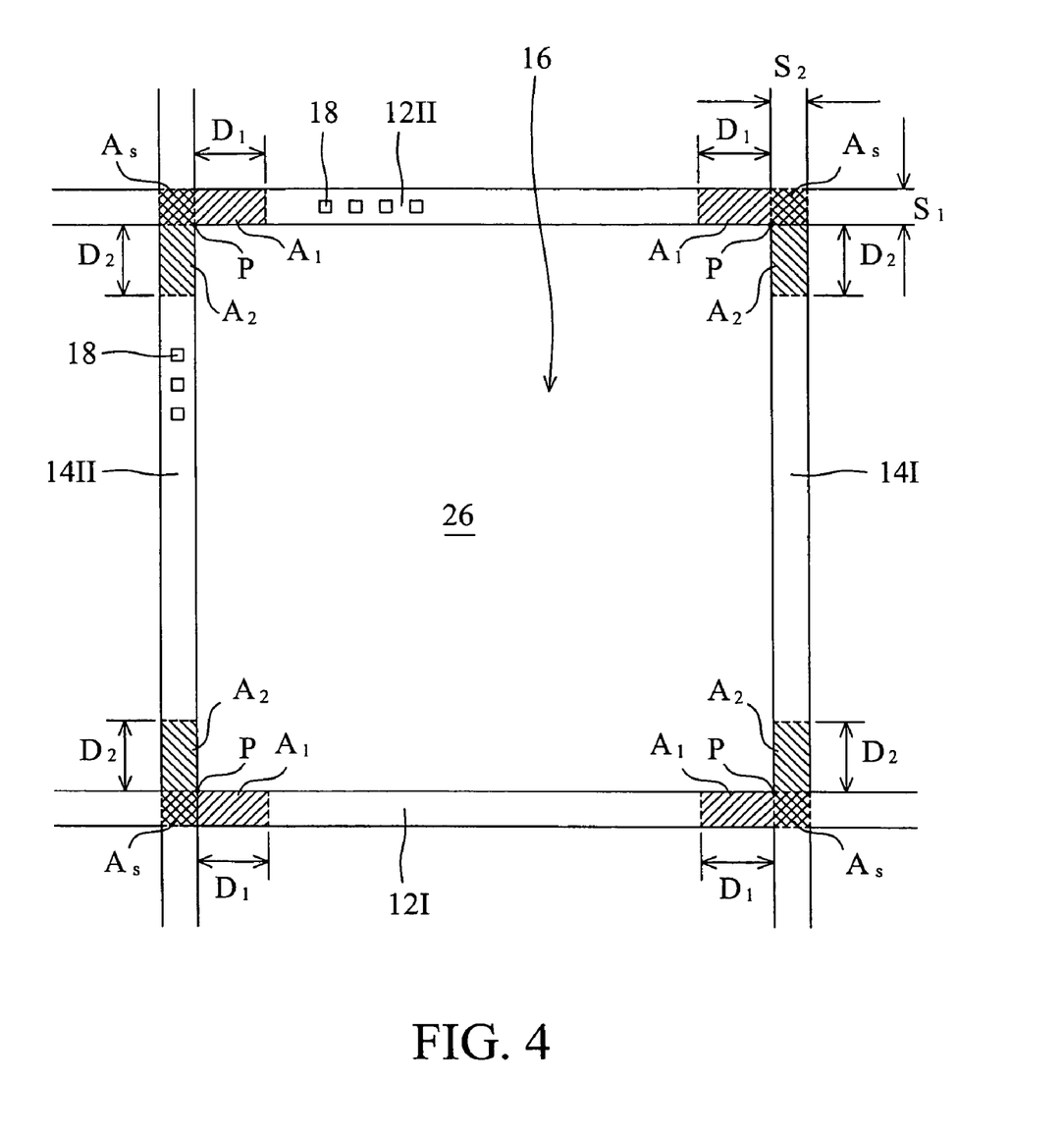
FIG. 4 is a top view illustrating a free area restricting test key placement on a scribe line adjacent one die according to one more embodiment of the present invention.

A free area that restricts test key placement on the scribe lines adjacent four corners of the individual die is described below with respect to FIG. 4.

A pair of first scribe lines 12I and 12II and a pair of second scribe lines 14I and 14II separate the die 16 and define four corner points P of the main area 26. Also, depending on the test key design rule, test keys 18 are formed without restriction on the first scribe lines 12I and 12II and the second scribe lines 14I and 14II adjacent the die 16, except for free areas $A_1$, $A_2$, $A_S$ near the four corner points P.

The free areas restricting test key placement on the scribe lines adjacent four dies are described below.

Figure 5:
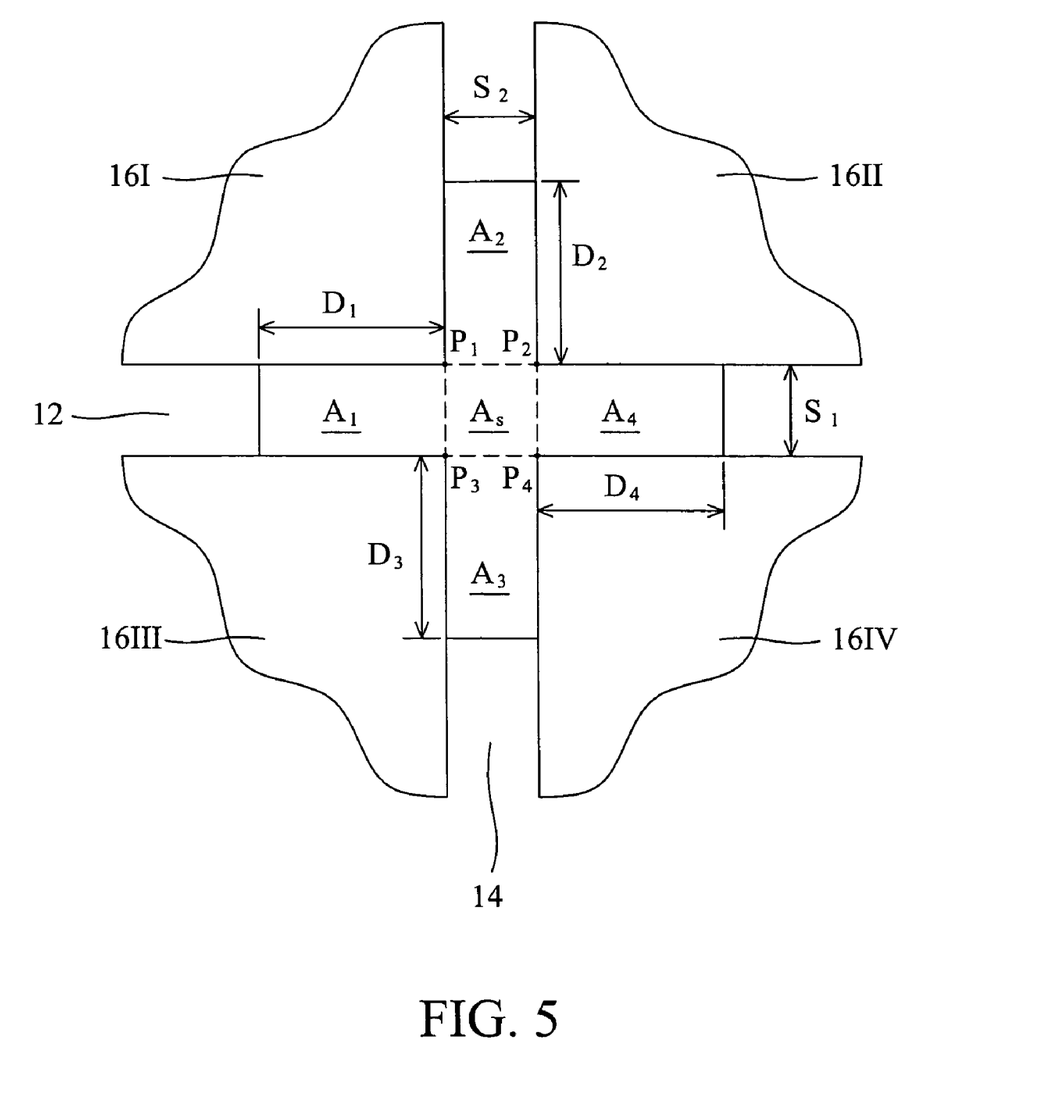
FIG. 5 is a top view illustrating free areas restricting test key placement on a scribe line adjacent four dies according to another embodiment of the present invention.

FIG. 5 is a top view illustrating a sixth example of free areas restricting test key placement on the scribe lines adjacent to four dies.

Four of the individual dies 16I, 16II, 16III, and 16IV are separated from each other by a first scribe line 12 and a second scribe line 14, in which corner points $P_1$, $P_2$, $P_3$, $P_4$ of the four dies 16I, 16II, 16III, and 16IV respectively define the intersection of the first scribe line 12 and the second scribe line 14. Also, depending on the test key design rule, test keys 18 are formed without restriction on the first scribe line 12 and the second scribe line 14 adjacent the dies 16I, 16II, 16III, and 16IV, except for free areas $A_1$, $A_2$, $A_3$, $A_4$, and $A_S$ adjacent the four corner points $P_1$, $P_2$, $P_3$, $P_4$ of the dies 16I, 16II, 16III, and 16IV.

The free area $A_1$ is on the first scribe line 12 between the first die 16I and the third die 16III adjacent the corner points $P_1$ and $P_3$. The free area $A_1$ is defined by the equation $A_1=D_1\times S_1$, where $D_1$ is a first distance from the corner point $P_1$ of the first die 16I toward the main area of the first die 16I, and $S_1$ is the width of the first scribe line 12. Preferably, $D_1$ is less than 600 μm and $S_1$ is greater than 20 μm. A limited number of keys 18 may be formed in the area $A_1$ so long as the measurement ratio $R_1$ is less than about 10%. $R_1$ is defined by the equation $R_1=M_1/A_1$, where $M_1$ is the total area of the test keys 18 formed on the free area $A_1$.

The free area $A_2$ is on the second scribe line 14 between the first die 16I and the second die 16II adjacent the corner points $P_1$ and $P_2$. The free area $A_2$ is defined by the equation $A_2=D_2\times S_2$, where $D_2$ is a second distance from the corner point $P_2$ of the second die 16II toward the main area of the second die 16II, and $S_2$ is the width of the second scribe line 14. Preferably, $D_2$ is less than 600 μm, and $S_2$ is greater than 20 μm. As was the case for the free area $A_1$, a limited number of test keys 18 may be formed in the area $A_2$ so long as the measurement ratio $R_2$ is less than 10%. Similar to the above discussions, $R_2$ is defined by the equation $R_2=M_2/A_2$, where $M_2$ is the total area of the test keys 18 formed on the free area $A_2$.

The free area $A_3$ is on the second scribe line 14 between the third die 16III and the fourth die 16IV adjacent the corner points $P_3$ and $P_4$. The free area $A_3$ is defined by the equation: $A_3=D_3\times S_2$, where $D_3$ is the distance from the corner point $P_3$ of the third die 16III toward the main area of the third die 16III. Preferably, $D_2$ is less than 600 μm, and $S_2$ is greater than 20 μm. As discussed above with respect to areas $A_1$ and $A_2$, a limited number of test keys 18 can be formed in area $A_3$ so long as the measurement ratio $R_3$ is less than 10%. $R_3$ is defined by the equation $R_3=M_3/A_3$, where $M_3$ is the total area of the test keys 18 formed on the free area $A_3$.

The free area $A_4$ is on the first scribe line 12 between the second die 16II and the fourth die 16IV adjacent the corner points $P_2$ and $P_4$. The free area $A_4$ is defined by the equation: $A_4=D_4\times S_1$, where $D_4$ is the distance from the corner point $P_4$ of the fourth die 16IV toward the main area of the fourth die 16IV. Preferably, $D_4$ is less than 600 μm. Again, if test keys are to be formed in area $A_4$, the measurement ratio $R_4$ must be less than about 10%. As before, R4 is defined by the equation $R_4=M_4/A_4$, where $M_4$ is the total area of the test keys 18 formed on the free area $A_4$.

The free area $A_S$ is on the intersection of the first scribe line 12 and the second scribe line 14 adjacent the corner points $P_1$, $P_2$, $P_3$ and $P_4$. The free area $A_S$ is defined by the equation: $A_S=S_1\times S_2$, where $S_1$ is the width of the first scribe line 12, and $S_2$ is a width of the second scribe line 14. Preferably, $S_1$ is greater than 20 μm, and $S_2$ is also greater than 20 μm. As discussed above, test keys formed in area $A_S$ must be limited such that the measurement ratio $R_S$ is less than 10%. $R_S$ is defined by the equation $R_S=M_S/A_S$, where $M_S$ is the total area of the test keys 18 formed on the free area $A_S$.

In addition, each of the free areas $A_1$, $A_2$, $A_3$, $A_4$, and $A_S$ is on at least one layer of the multi-layer structure 24 of the scribe line 12 or 14. Preferably, each of the free areas $A_1$, $A_2$, $A_3$, $A_4$, and $A_S$ is on the top of the multi-layer structure 24. Alternatively, each of the free areas $A_1$, $A_2$, $A_3$, $A_4$ and $A_S$ is on at least one of the top three layers of the multi-layer structure 24.

Figure 6:
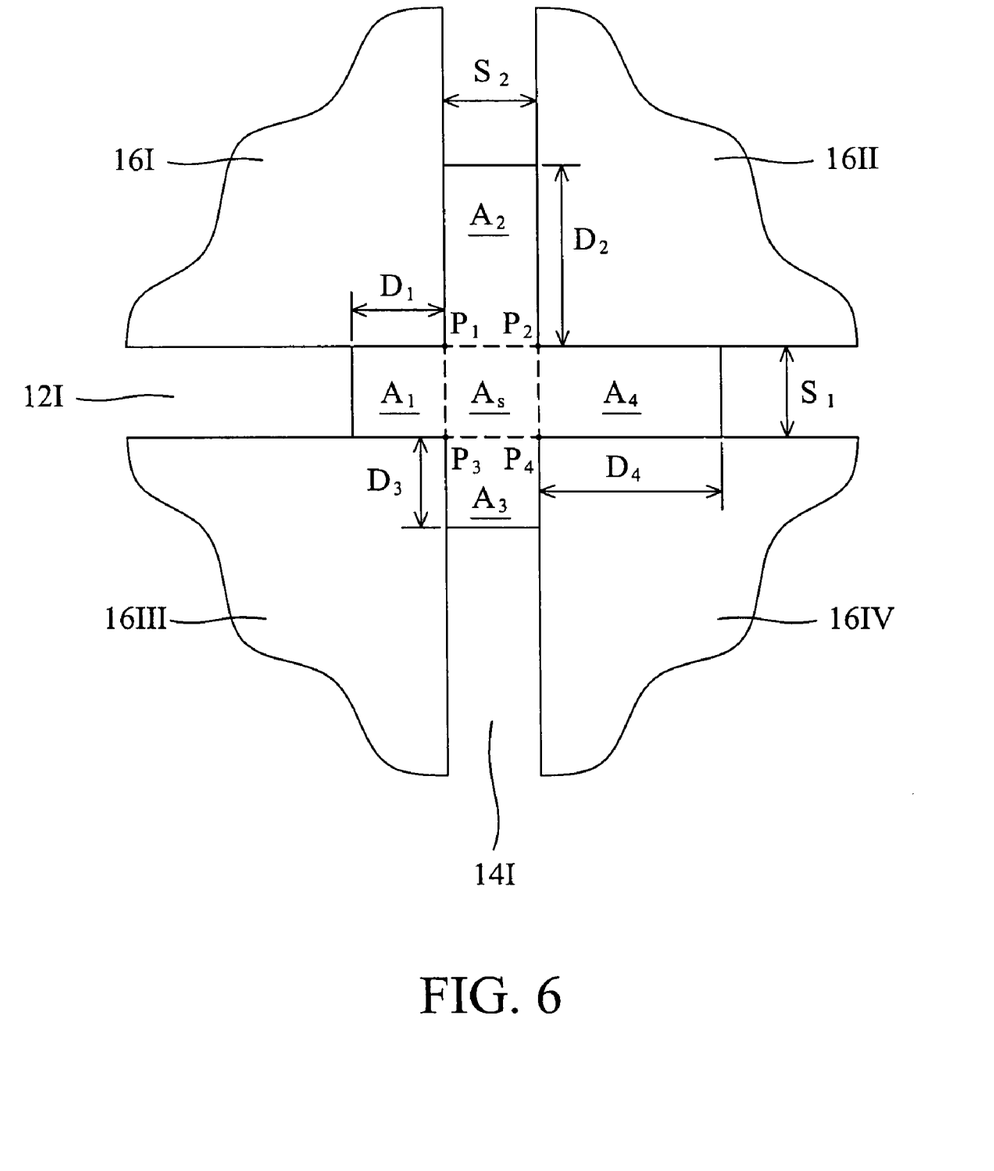
FIG. 6 is a top view illustrating free areas restricting test key placement on a scribe line adjacent four dies according to another embodiment of the present invention.

FIG. 6 is a top view illustrating free areas prohibiting test key placement on the scribe lines adjacent four dies according to yet another example of the present invention. Elements similar to those described in FIG. 5 are omitted here.

The free areas $A_1$, $A_2$, $A_3$, $A_4$, and $A_S$ are asymmetrical patterns, in which $D_1\neq D_4$, and $D_2\neq D_3$.

In comparison with the conventional art, the several examples of the present invention provide free areas restricting test key placement on the scribe lines to prevent peeling near the test keys at the die corners from stress exerted during the sawing process, thus avoiding delamination at the interface between the multi-layers at the die corners. The free areas restricting test key placement on the scribe lines ensure reliability of the IC device.

Another embodiment of the present invention provides a conductive structure that encloses a main area of a die. The conductive structure defines an array of apertures at the corner of the die in order to prevent the die from being cracked by stresses exerted at the corners of a die. The use of the apertures in the conductive structure is particularly effective to prevent cracks in wafers using low-k materials. Moreover, the conductive structure with the array of apertures can be combined with the free areas restricting test key placement to achieve the advantages of both.

Figure 7:
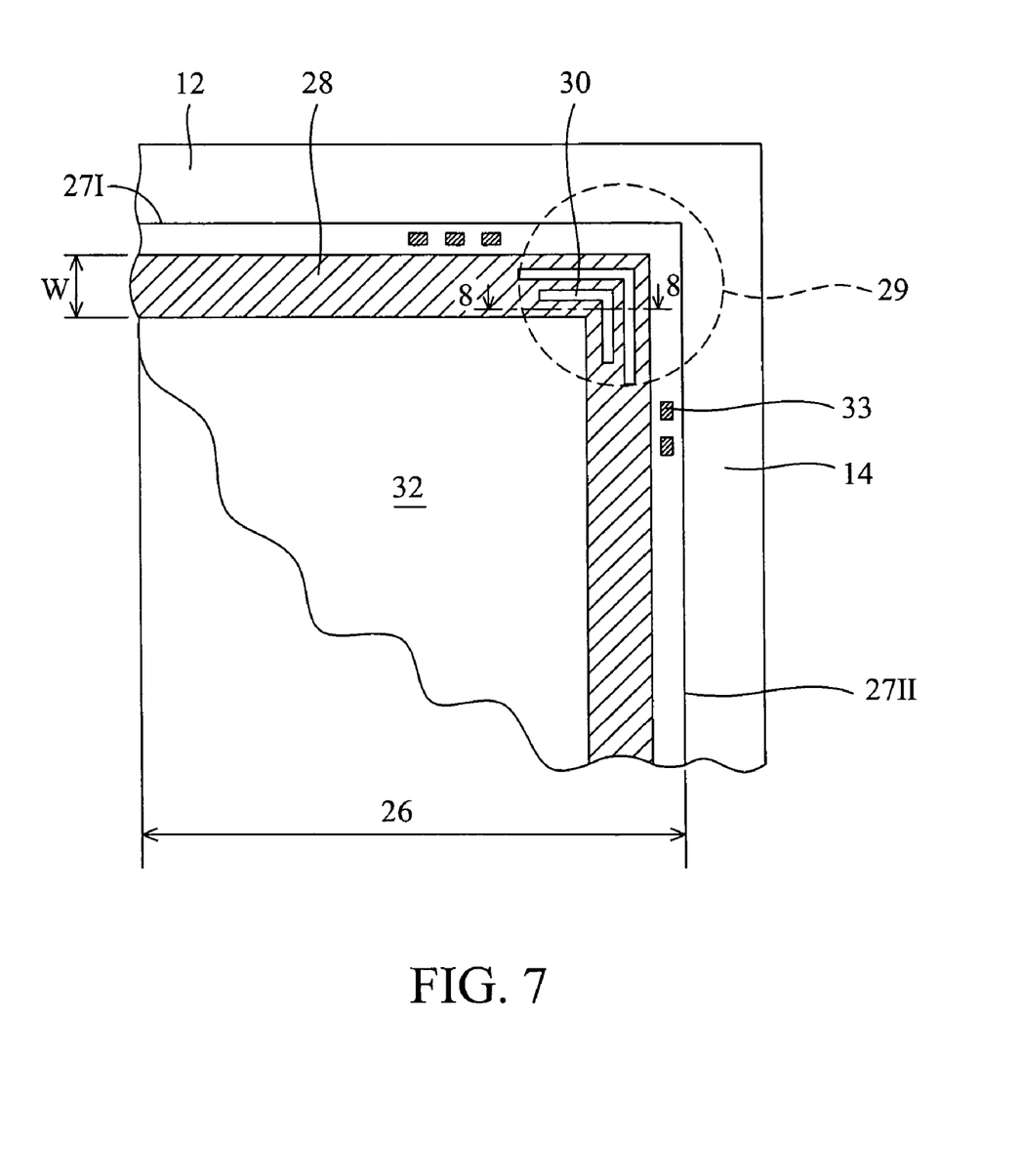
FIG. 7 is a top view of a main area of a die having a pair of slots defined in a guard ring surrounding the die according to the present invention.

FIG. 7 is a top view of a main area of a die having an array of apertures according to the present invention. Elements similar to those discussed with respect to the earlier figures are omitted here.

The main area 26 of the die 16 is defined by the intersection of the first scribe line 12 and the second scribe line 14. The main area 26 includes a first peripheral region 27I defined along the first direction, a second peripheral region 27II defined along the second direction, and a corner area 29 defined by the intersection of the first peripheral region 27I and the second peripheral region 27II. A conductive structure or "ring" 28 is formed on the main area 26 and extends adjacent the first peripheral region 27I and the second peripheral region 27II. It is noted that the phrase "conductive ring" as used herein is intended to cover rectangular or square shaped seals as well as round seals. An array of apertures, such as one or more slots 30, is formed in the conductive ring 28 and adjacent to the corner area 29. Moreover, circuit elements and wirings are formed on the circuit area 32, which is enclosed by the conductive ring 28. The conductive ring 28 is electrically connected to the circuit elements to apply a power source or a ground potential for circuit elements on the enclosed die. Preferably, a width W of the conductive ring 28 is approximately 20-350 µm. In addition, a plurality of bonding pads 33 is formed outside the conductive ring 28 and on the first peripheral region 27I and the second peripheral region 27II.

Figure 8:
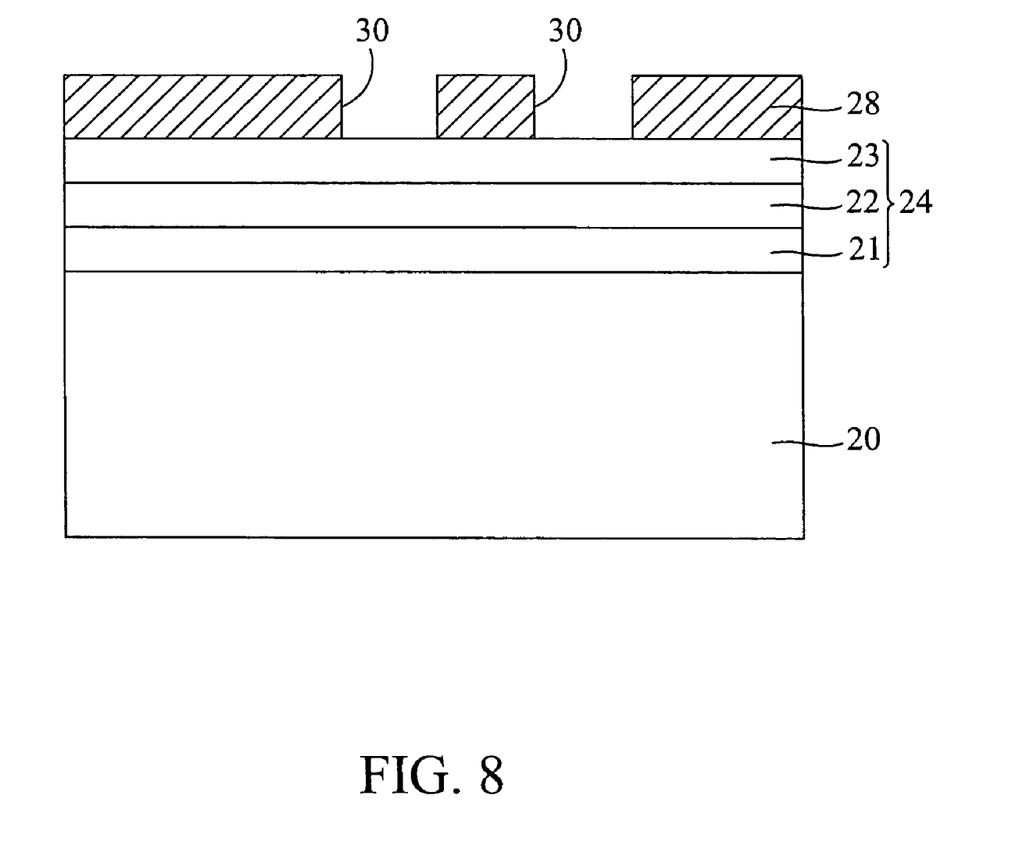
FIG. 8 is a cross-section along line 8-8 of FIG. 7.

The main area 26 of the die 16 may be formed on an LK (low-k dielectric) wafer, and the corner area 29 is part of the multi-layer structure. FIG. 8 is a cross-section along line 8-8 of FIG. 7 illustrating the pair of slots 30. In the main area 26, the conductive ring 28 with the slots 30 is formed on a multi-layer structure 24 of a substrate 20. The multi-layer structure 24 comprises layers 21, 22, and 23. Preferably, at least one of the layers 21, 22, and/or 23 is a low-k dielectric layer of a dielectric constant (k) lower than approximately 3.5 and preferably lower than about 3.0. For example, the low-k dielectric layer may be CVD SiOC, CVD SiOCN, Spin-on SiOC, CVD polymer, Spin-on polymer, FSG, or $SiO_2$.

FIG. 8 is a top view illustrating one example of a suitable array of apertures. According to this embodiment, the array of apertures comprises a pair of slots 30 located at the corner of the die 32. At least one portion of a slot extends parallel to the first direction or the second direction. According to the illustration of FIG. 8, the array of apertures comprises a pair of slots having an L-shape formed in the conductive ring 28 at the corner portion of the die 32. As shown, the apertures comprise at least two L-shaped slots 30 formed in the corner portion of the conductive ring 28.

Figure 9:
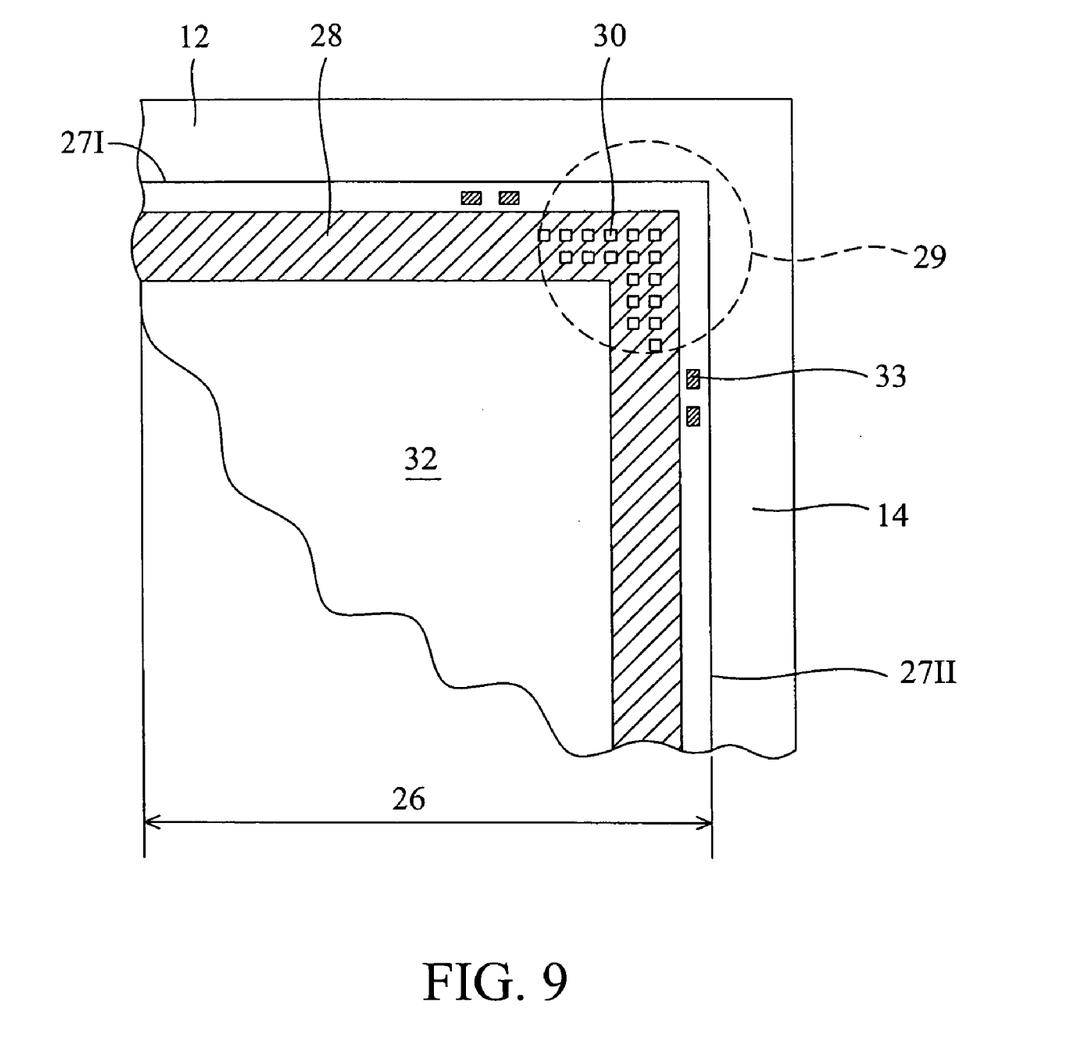
FIG. 9 is a top view similar to FIG. 7 except it shows rows of holes formed in the guard ring.

FIG. 9 is a top view of another example of an array of apertures in the conductive ring 28. The array of apertures comprises two rows of holes in the corner portion of the conductive ring 28. Furthermore, the array of holes may extend only parallel to one of the first peripheral region 27I or the second peripheral region 27II. Alternately, the two rows of holes may be L-shaped as shown in FIG. 9.

Figure 10A:
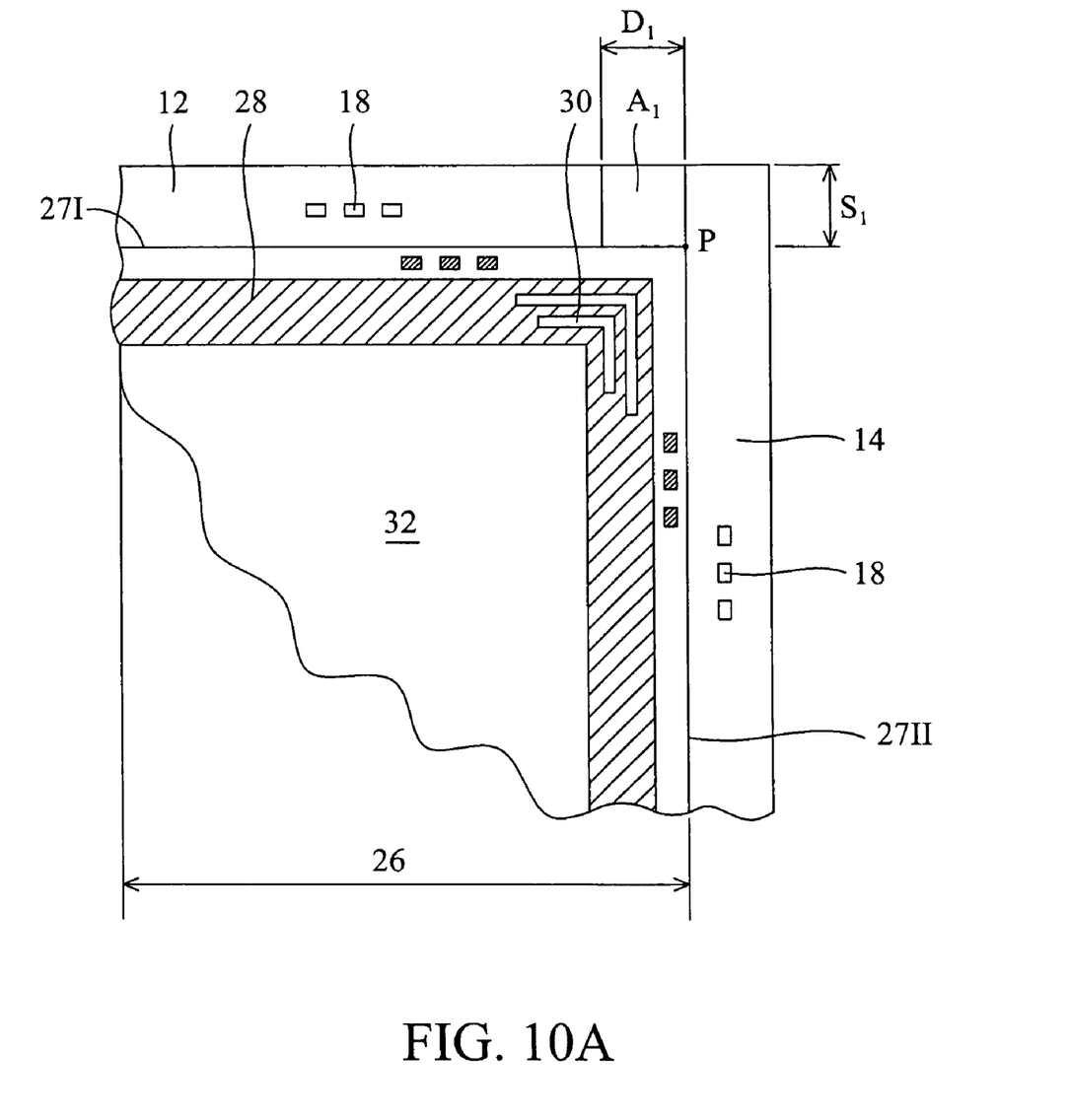
FIGS. 10A-10C are top views of another embodiment of the invention showing an array of slots in the guard ring combined with the test key design rule on a scribe line as disclosed in FIGS. 3A-6.
Figure 10B:
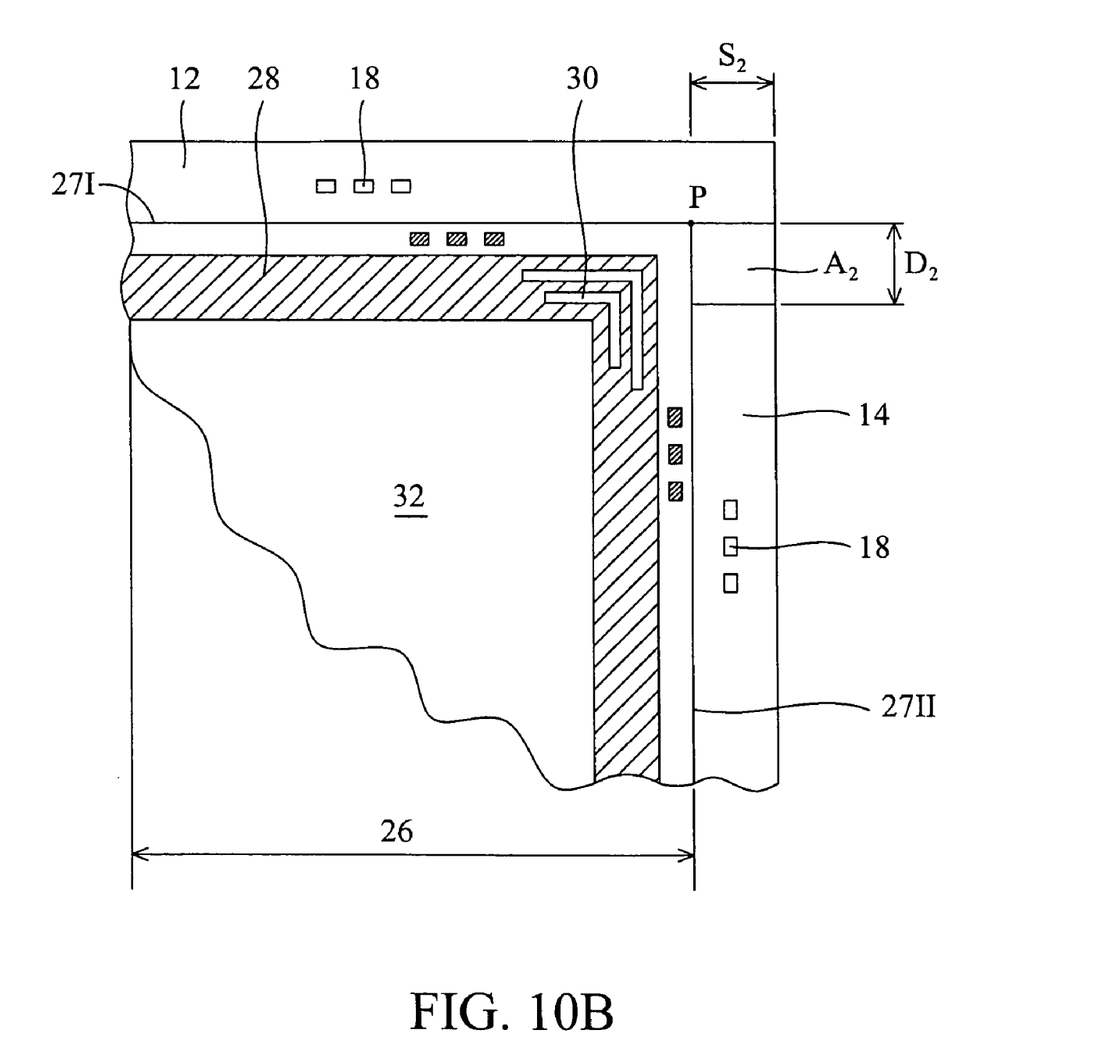
Figure 10C:
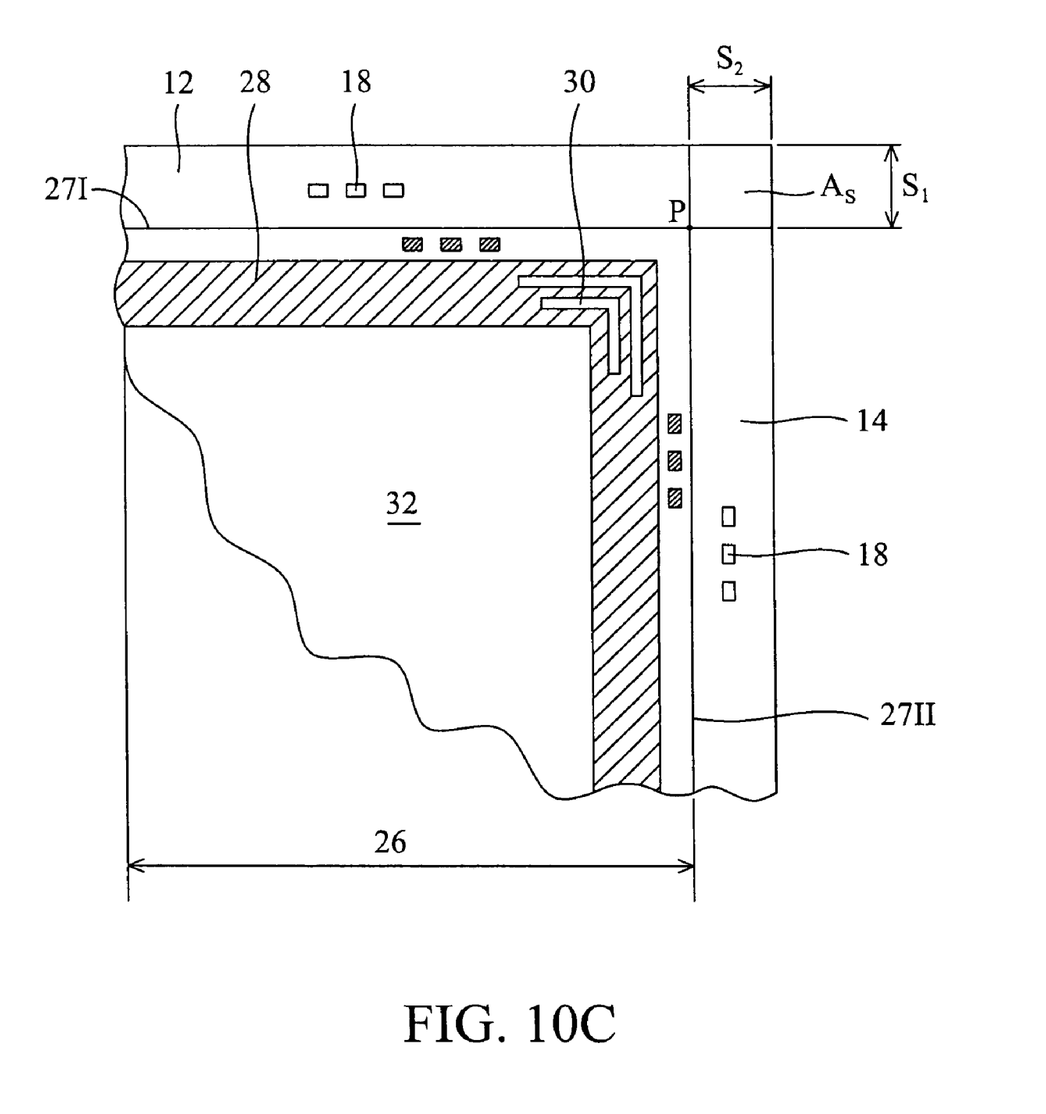

FIGS. 10A-10C are top views of other examples of the conductive ring 28 with apertures combined with the design rule for restricting the placement of test keys on a scribe line as described above. Elements similar to those found in FIGS. 3A-3C and FIG. 7 are omitted here.

Depending on the test key design rule, the test keys 18 are formed without restriction on the first scribe line 12 or the second scribe line 14, except for the free areas $A_1$, $A_2$, and $A_S$ near the corner point P of the main area 26.

In FIG. 10A, test keys 18 are formed on the first scribe line 12 or the second scribe line 14, except for a free area $A_1$ near the corner point P. The free area $A_1$ is on the first scribe line 12 adjacent to the corner point P. The free area $A_1$ is defined by the equation $A_1=D_1 \times S_1$. Moreover, a few test keys 18 may be formed on the free area $A_1$ if the measurement ratio $R_1$ is less than about 10%. $R_1$ is defined by the equation $R_1=M_1/A_1$, where $M_1$ is the total area of the test keys 18 formed on the free area $A_1$.

In FIG. 10B, test keys 18 are formed without restriction on the first scribe line 12 or the second scribe line 14, except for on a free area $A_2$ near the corner point P. The free area $A_2$ is on the second scribe line 14 adjacent to the corner point P. The free area $A_2$ is defined by the equation $A_2=D_2 \times S_2$. Moreover, a few test keys 18 may be formed on the free area $A_2$ if the measurement ratio $R_2$ is less than 10%. $R_2$ is defined by equation $R_2=M_2/A_2$, where $M_2$ is the total area of the test keys 18 formed on the free area $A_2$.

In FIG. 10C, test keys 18 are formed without restriction on the first scribe line 12 or the second scribe line 14, except for a free area $A_S$ near the corner point P. The free area $A_S$ is on the intersection of the first scribe line 12 and the second scribe line 14 adjacent the corner point P. The free area $A_S$ is defined by the equation $A_S=S_1 \times S_2$. Moreover, a few test keys 18 can be formed on the free area $A_S$ if the measurement ratio $R_2$ is less than 10%. $R_2$ is defined by the equation $R_S=M_S/A_S$, where $M_S$ is the total area of the test keys 18 formed on the free area $A_S$.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, manufacture, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, manufacture, means, methods, or steps.

What is claimed is:

1. A multi-layer semiconductor wafer structure defining a multiplicity of dies formed thereon, said wafer structure comprising:

at least two first scribe lines having a selected width $S_1$, each of said at least two first scribe lines extending along a first orientation and defining a first edge of at least two first dies of said multiplicity of dies;

at least two second scribe lines having a selected width $S_2$, each of said at least two second scribe lines extending along a second orientation and defining a second edge of at least two second dies and intersecting said at least two first scribe lines, and said first edges of said at least two first dies and said second edges of said at least two second dies intersecting at corner points;

first restricted areas $A_1$ defined on said first scribe line where placement of a test key is restricted, and said first restricted areas $A_1$ being defined by the equation $A_1=D_1 \times S_1$, where D1 is the distance along the first edge extending from a corner point of said at least two first dies;

second restricted areas $A_S$ at intersections of said at least two first scribe lines and said at least two second scribe lines, said second restricted areas $A_S$ being defined by the equation $A_S=S_1 \times S_2$;

at least one first test key formed on each one of said at least two first and said at least two second scribe lines, but not on said restricted areas A and $A_S$; and at least one second test key formed in at least one of said $A_1$ restricted areas and said $A_S$ restricted areas.

2. The multi-layer semiconductor wafer structure of claim 1 wherein at least one layer of said wafer structure is a low-k dielectric layer.

3. The multi-layer semiconductor wafer structure of claim 2 wherein the low-k dielectric layer is a material selected from the group consisting of CVD-SiOC, SiOCN, Spin-on SiOC, CVD deposited polymer, Spin-on polymer, FSG, $SiO_2$ and combinations thereof.

4. The multi-layer semiconductor wafer structure of claim 2 wherein the low-k dielectric layer has a dielectric constant of less than approximately 3.5.

5. The multi-layer semiconductor wafer structure of claim 4 wherein the low-k dielectric layer has a dielectric constant of less than 3.0.

6. The multi-layer semiconductor wafer structure of claim 1 wherein the free areas are defined on the top layer of the multi-layer structure.

7. The multi-layer semiconductor wafer structure of claim 1 wherein the free areas are defined on at least one of the top three layers of the multi-layer structure.

8. The multi-layer semiconductor wafer structure of claim 1 wherein said at least one second test key is formed in one of said first restricted areas, said at least one second test key having a measurement ratio $R_1$, wherein the measurement ratio is defined by the equation:

$R_1=M_1/A_1$, wherein $M_1$ is the total area of said at least one second test key formed on the first restricted area $A_1$, and $R_1$ is less than about 10%.

9. The multilayer semiconductor wafer structure of claim 8 wherein at least another second test key is formed on said second restricted area $A_S$, said at least another second test key having a measurement ratio $R_S$ that is less than 10%, said measurement ration $R_S$ defined by the equation $R_S=M_S/A_S$, wherein $M_S$ is the total area of said at least another second test key formed on said second restricted area $A_S$.

10. The multi-layer semiconductor wafer structure of claim 1 wherein the distance $D_1$ is less than about 600 µm.

11. The multi-layer semiconductor wafer structure of claim 1 wherein the width $S_1$ of the first scribe line is greater than about 20 µm.

12. The multi-layer semiconductor wafer structure of claim 1 wherein the multi-layer structure is formed on a substrate selected from the group consisting of bulk Si, SOI, SiGe, GaAs, InP, and a combination thereof.

13. The multi-layer semiconductor wafer structure of claim 1 wherein said first die comprises:
a first peripheral region inside of and extending parallel to said first scribe line;
a second peripheral region inside of and extending parallel to said second scribe line and intersecting said first peripheral region to form a corner area;
a conductive ring formed between said first die and said first peripheral region and said second peripheral region; and
an array of apertures formed in the conductive ring and adjacent the corner area of the first die.

14. The multi-layer semiconductor wafer structure of claim 13 wherein said array of apertures comprises at least two slots.

15. The multi-layer semiconductor wafer structure of claim 13 wherein said array of apertures comprises two rows of holes.

16. The multi-layer semiconductor wafer structure of claim 13 wherein the array of apertures extends along at least one of the first peripheral region and the second peripheral region.

17. The multi-layer semiconductor wafer structure of claim 13 wherein the first die further comprises a circuit area with a plurality of circuit elements, wherein the conductive ring is electrically connected to the circuit elements to apply one of a power source and a ground potential to the circuit elements.

18. The multi-layer semiconductor wafer structure of claim 13 wherein the conductive ring has a width of between 50 µm and about 300 µm.

19. The multi-layer semiconductor wafer structure of claim 1 wherein said at least one second test key is formed in one of said second restricted areas $A_S$, said second test key having a measurement ratio $R_S$ that is less than 10% and is defined by the equation $R_S=M_S/A_S$, wherein $M_S$ is the total area of said at least one second test key formed on the second restricted area $A_S$.

20. The multi-layer semiconductor wafer structure of claim 1 wherein the width of the scribe lines $S_1$ and $S_2$ is greater than about 20 µm.

21. The multi-layer semiconductor wafer structure of claim 1 wherein said at lest one first restricted area comprises a first free area $A_1$ on the first scribe line and another first free area $A_2$ on the second scribe line, said second free area defined by the equation $A_2=D_2 \times S_2$ where $D_2$ is the distance along the second edge extending from the corner point of the first die and $S_2$ is the width of the second scribe line.

22. The multi-layer semiconductor wafer structure of claim 21 further comprising:
at least one test key formed on at least one of the free areas $A_1$, $A_2$ and $A_S$;
wherein a first measurement ratio $R_1$ is defined as the equation $R_1=M_1/A_1$, wherein $M_1$ is the total area of the test keys formed on the first free area $A_1$;
wherein a second measurement ratio $R_2$ is defined as the equation $R_2=M_2/A_2$, wherein $M_2$ is the total area of the test keys formed on the second free area $A_2$;
wherein a third measurement ratio $R_S$ is defined as the equation $R_S=M_S/A_S$, wherein $M_S$ is the total area of the test keys formed on the third area $A_S$; and
wherein a total measurement ratio $R$ is defined as the equation $R=(M_1+M_2+M_S)/(A_1+A_2+A_S)$.

23. The multi-layer semiconductor wafer structure of claim 22 wherein $R_1$ is less than about 10%.

24. The multi-layer semiconductor wafer structure of claim 22 wherein $R_2$ is less than about 10%.

25. The multi-layer semiconductor wafer structure of claim 22 wherein $R_S$ is less than about 10%.

26. The multi-layer semiconductor wafer structure of claim 22 wherein the ratio $R$ is less than about 10%.

27. The multi-layer semiconductor wafer structure of claim 21 wherein the first distance $D_1$ is less than about 600 µm.

28. The multi-layer semiconductor wafer structure of claim 21 wherein the distance $D_2$ along the second direction is less than about 600 µm.

29. The multi-layer semiconductor wafer structure of claim 21 wherein the width $S_1$ of the first scribe line is greater than about 20 µm.

30. The multi-layer semiconductor wafer structure of claim 21 wherein the width $S_2$ of the second scribe line is greater than about 20 µm.

* * * * *